(12) United States Patent
Bhargava et al.

(10) Patent No.: US 10,115,473 B1
(45) Date of Patent: Oct. 30, 2018

(54) METHOD, SYSTEM AND DEVICE FOR CORRELATED ELECTRON SWITCH (CES) DEVICE OPERATION

(71) Applicant: ARM Ltd., Cambridge (GB)

(72) Inventors: Mudit Bhargava, Austin, TX (US); Vikas Chandra, Fremont, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/480,879

(22) Filed: Apr. 6, 2017

(51) Int. Cl.
| | | |
|---|---|---|
| *G11C 11/00* | (2006.01) | |
| *G11C 17/18* | (2006.01) | |
| *G06F 12/14* | (2006.01) | |
| *G06F 1/24* | (2006.01) | |
| *G11C 17/16* | (2006.01) | |

(52) U.S. Cl.
CPC .............. *G11C 17/18* (2013.01); *G06F 1/24* (2013.01); *G06F 12/1425* (2013.01); *G11C 17/16* (2013.01)

(58) Field of Classification Search
CPC G11C 17/18; G11C 17/16; G06F 1/24; G06F 12/1425
See application file for complete search history.

(56) References Cited

U.S. PATENT DOCUMENTS

| | | | |
|---|---|---|---|
| 7,236,409 B2 * | 6/2007 | Isobe .................. | G11C 29/02 365/100 |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 8,305,795 B2 * | 11/2012 | Azuma ............... | G11C 13/0007 365/148 |
| 8,331,134 B2 * | 12/2012 | Chiu .................. | G11C 13/0002 365/154 |
| 9,053,789 B1 | 6/2015 | Ertosun | |
| 9,373,410 B1 | 6/2016 | Kumar | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 2004/0239369 A1 | 12/2004 | Hsu et al. | |
| 2008/0106925 A1 * | 5/2008 | Paz de Araujo ........ | H01L 45/04 365/148 |
| 2008/0106926 A1 | 5/2008 | Brubaker | |
| 2008/0107801 A1 | 5/2008 | Celinska et al. | |
| 2013/0200323 A1 | 8/2013 | Pham et al. | |

(Continued)

FOREIGN PATENT DOCUMENTS

WO     20090140305 A1     11/2009

OTHER PUBLICATIONS

U.S. Appl. No. 15/086,767, filed Mar. 31, 2016, 49 pgs.

(Continued)

*Primary Examiner* — Pho M Luu
(74) *Attorney, Agent, or Firm* — Berkeley Law & Technology Group, LLP

(57) ABSTRACT

Described are methods, systems and devices for operation of correlated electron switch (CES) devices. A CES device may be placed in a conductive or low impedance state, or an insulative or high impedance state. A programming signal may be applied a CES device with a sufficiently high current to permanently place the CES device in the conductive or low impedance state.

19 Claims, 6 Drawing Sheets

(56) References Cited

U.S. PATENT DOCUMENTS

| | | |
|---|---|---|
| 2013/0201748 A1 | 8/2013 | Chung |
| 2013/0214232 A1 | 8/2013 | Tendulkar et al. |
| 2013/0285699 A1 | 10/2013 | McWilliams et al. |
| 2016/0163978 A1 | 6/2016 | Paz De Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

First Office Action, dated Sep. 8, 2016, U.S. Appl. No. 15/086,767, filed Mar. 31, 2016, 12 pgs.
Response filed Dec. 8, 2016, U.S. Appl. No. 15/086,767, filed Mar. 31, 2016, 14 pgs.
Final Office Action, dated Mar. 31, 2017, U.S. Appl. No. 15/086,767, filed Mar. 31, 2016, 20 pgs.
Notification of Transmittal of the International Search Report and the Written Opinion of the International Searching Authority, or the Declaration, dated Jul. 3, 2018, International Application No. PCT/GB2018/050907, 1 pg.
The International Search Report, dated Jul. 3, 2018, International Application No. PCT/GB2018/050907, 5 pgs.
The Written Opinion of the International Searching Authority, dated Jul. 3, 2018, International Application No. PCT/GB2018/050907, 11 pgs.

\* cited by examiner

METHOD, SYSTEM AND DEVICE FOR CORRELATED ELECTRON SWITCH (CES) DEVICE OPERATION

BACKGROUND

1. Field

Disclosed are techniques for utilizing memory devices.

2. Information

One-time programmable (OTP) memory is a form of programmable read-only memory in which data is stored permanently and cannot be modified. In other words, OTP memory can only be programmed to store data once, and the stored data cannot be rewritten/overwritten. A typical OTP memory cell may be formed or "born on" with bits having a logical state of "1." An electric signal may be used to burn a fuse that effectively allows setting of one or more bits of an OTP memory cell. That is, burning a fuse using the electrical signal may change a logical state from "1" to "0."

SUMMARY

Briefly, particular implementations are directed to a method comprising: applying a first programming signal generated by a write circuit to terminals of a correlated electron switch (CES) element to provide a first current in the CES element sufficient to place the CES element in a high impedance or insulative state; and applying a second programming signal from the write circuit to the terminals of the CES element to provide a voltage across terminal of the CES element sufficient to place the CES element in a low impedance or conductive state, the second programming signal further providing a second current in the CES element having a magnitude greater than a magnitude of the first current, wherein the magnitude of the second current is sufficiently high to prevent a subsequent transition of the CES element to the high impedance or insulative state responsive to a subsequently applied programming signal generated by the write circuit.

Another implementation is directed to an apparatus comprising: one or more correlated electron switch (CES) elements; and a write circuit to: generate a first programming signal for application to terminals of at least one of the one or more CES elements to provide a first current to terminals of the at least one of the one or more CES elements sufficient to place the at least one of the one or more CES elements in a high impedance or insulative state; and generate a second programming signal for application to the terminals of the at least one of the one or more CES elements to provide a second current in the at least one of the one or more CES elements having a magnitude greater than a magnitude of the first current, wherein the magnitude of the second current is sufficiently high to prevent a subsequent transition of the at least one of the one or more CES elements to the high impedance or insulative state responsive to a subsequently applied programming signal generated by the write circuit.

Another particular implementation is directed to a method comprising: resetting a correlated electron switch (CES) element to a high impedance or insulative state to permit at least one type of access to a secure device; and setting the CES element to permanently place the CES element in a low impedance or conductive state by application of a compliance current exceeding a maximum reset current to thereby subsequently prevent the at least one type of access to the secure device.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
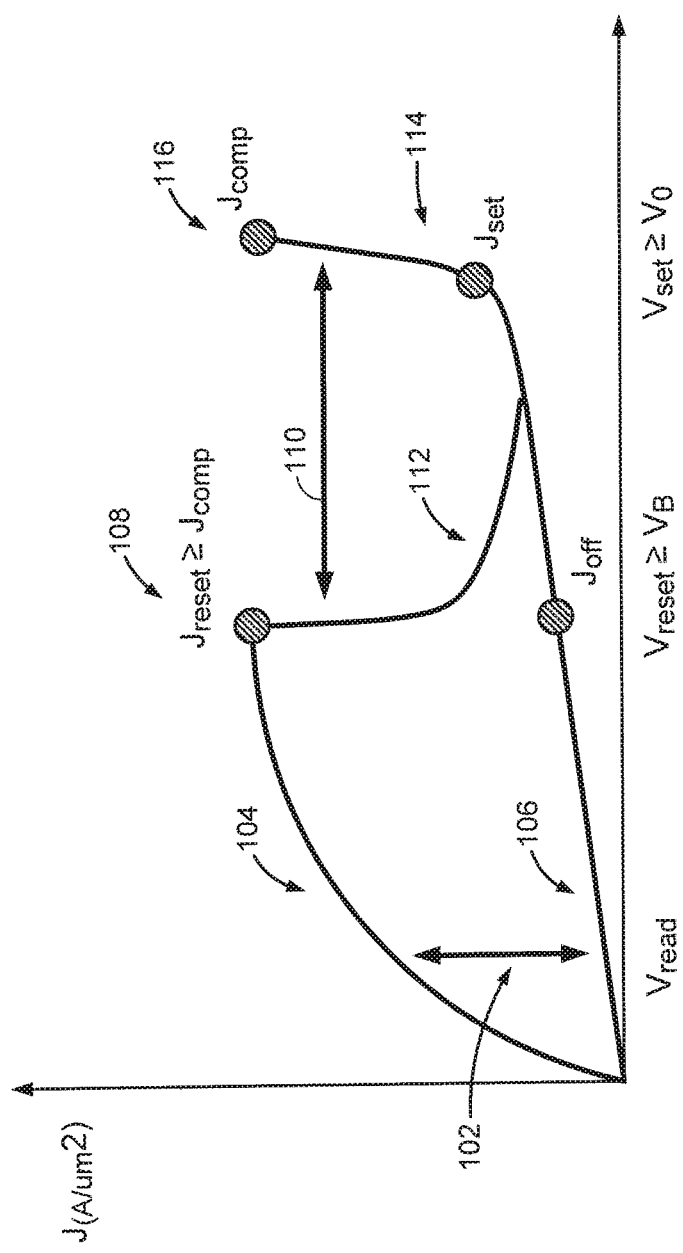
FIG. 1A is a plot of current density versus voltage for a CES device according to an embodiment.

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Embodiments described herein are directed to, among other things, an apparatus and method to provide a one-time programmable (OTP) memory. The apparatus may comprise at least one Correlated Electron Switch (CES) element comprising a correlated electron material (CEM) formed between terminals. The CES element may be used both as non-volatile storage as well as a circuit element that can enable connectivity or access in a circuit. As explained in more detail below, the CES element may comprise a material that may transition between predetermined detectable memory states based at least in part on a transition of (at least a portion of) the material between a conductive or low impedance state and an insulative or high impedance state. In one aspect, an operation to place the CES element in a conductive or low impedance state applies a current to the CES element that is sufficiently high to prevent a subsequent transition of the CES element to the high impedance or insulative state. In an implementation, placing the CES element permanently in the low impedance or conductive state may prevent future access to a secure device.

Particular aspects of the present disclosure incorporate a CEM to form a CES element. In this context, a CES element may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES element may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES element between an insulative state and a conductive state may be understood in terms of a Mott transition. In a Mott transition, a material may switch from an insulative state to conductive state if a Mott transition condition occurs. The criteria may be defined by the condition $(n_C)^{1/3} a = 0.26$), where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES element; a write circuit for placing the resistive switching memory cell in a first resistive state or a second resistive state depending on signals provided to the memory cell, wherein a resistance of the CES element is higher in the second resistance state than in the first resistance state; and a read circuit for sensing the state of the memory cell and providing an electrical signal corresponding to the sensed state of the memory cell. In a particular implementation, a CES element may switch resistive states responsive to a Mott-transition in the majority of the volume of the CES device. In one aspect, a CES element may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In this disclosure, the terms "CES device" and "CES element" may be used interchangeably. In a particular embodiment, a CES element may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES element according to an embodiment. Based, at least in part, on a voltage applied to terminals of the CES element (e.g., in a write operation), the CES element may be placed in a conductive state or an insulative state. For example application of a voltage $V_{set}$ and current density $J_{set}$ may place the CES element in a conductive memory state and application of a voltage $V_{reset}$ and a current density $J_{reset}$ may place the CES element in an insulative memory state. Following placement of the CES element in an insulative state or conductive state, the particular state of the CES element may be detected by application of a voltage $V_{read}$ (e.g., in a read operation) and detection of a current or current density at terminals of the CeRAM device.

According to an embodiment, the CES element of FIG. 1A may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES element. In an embodiment, a CES element may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES element of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES element may rapidly switch between a conductive state and an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES element is still in the insulative state, current may generated by transportation of electron holes. If enough bias is applied across terminals of the CES element, electrons may be injected into a metal-insulator-metal (MIM) diode over the potential barrier of the MIM device. If enough electrons have been injected and enough potential is applied across terminals to place the CES element in a particular low impedance or conductive state, an increase in electrons may screen electrons and remove a localization of electrons, which may collapse the band-splitting potential forming a metal.

According to an embodiment, current in a CES element may be controlled by an externally applied "compliance" condition determined based, at least in part, on an external current limited during a write operation to place the CES element in a conductive or low impedance state. This externally applied compliance current may also set a condition of a current density for a subsequent reset operation to place the CES element in a high impedance or insulative state. As shown in the particular implementation of FIG. 1A, a current density $J_{comp}$ applied during a write operation at point 116 to place the CES element in a conductive or low impedance state may determine a compliance condition for placing the CES element in a high impedance or insulative state in a subsequent write operation. As shown, the CES element may be subsequently placed in an insulative or high impedance state by application of a current density $J_{reset} \geq J_{comp}$ at a voltage $V_{reset}$ at point 108, where $J_{comp}$ is externally applied.

The compliance therefore may set a number of electrons in a CES element which are to be "captured" by holes for a Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p. This condition may be modeled according to expression (1) as follows:

$$\lambda_{TF} n^{\frac{1}{3}} C \sim 0.26 \qquad (1)$$
$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES element. Here, injection of holes may meet a Mott transition criterion for the conductive state to insulative state transition at current $I_{MI}$ as a critical voltage $V_{MI}$ is applied across terminals of CES element. This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

Where Q(V$_{MI}$) is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:

$\lambda_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES element to a conductive memory state, as enough electrons have been injected and the potential across terminal of the CES element overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES element to the conductive state at a critical voltage $V_{MI}$ enabling transition to the conductive state may be expressed according to expression (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) = J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3$$

where:

$a_B$ is a Bohr radius.

According to an embodiment, a "read window" 102 for detecting a memory state of a CES element in a read operation may be set out as a difference between a portion 106 the plot of FIG. 1A while the CES element is in an insulative state and a portion 104 of the plot FIG. 1A while the CES element is in a conductive state at a read voltage $V_{read}$. In a particular implementation, read window 102 may be used to determine a Thomas Fermi screening length $\lambda_{TF}$ of material making up the CES element. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

In another embodiment, a "write window" 110 for placing a CES element in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined based, at least in part, by materials and doping of the CES element.

Figure 1B:
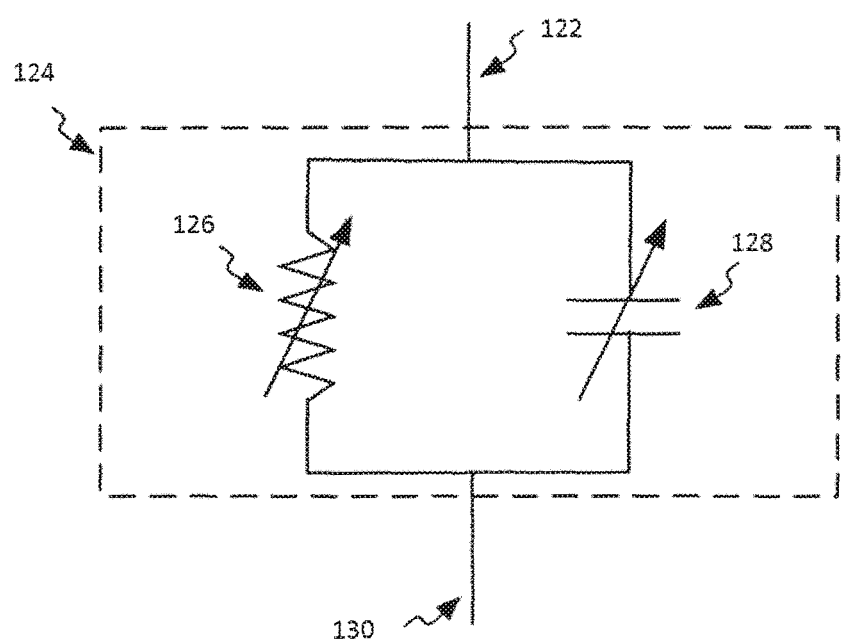
FIG. 1B is a schematic diagram of an equivalent circuit to a CES device according to an embodiment.

The transition from high resistance/capacitance to low resistance/capacitance in a CES element may be represented by a singular impedance of the CES element. FIG. 1B depicts a schematic diagram of an equivalent circuit of an example variable impeder device (such as a CES element), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM element comprises characteristics of variable capacitance and variable resistance. Table 1 below depicts an example truth table for an example variable impeder device, such as variable impeder device 100.

TABLE 1

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Figure 2:
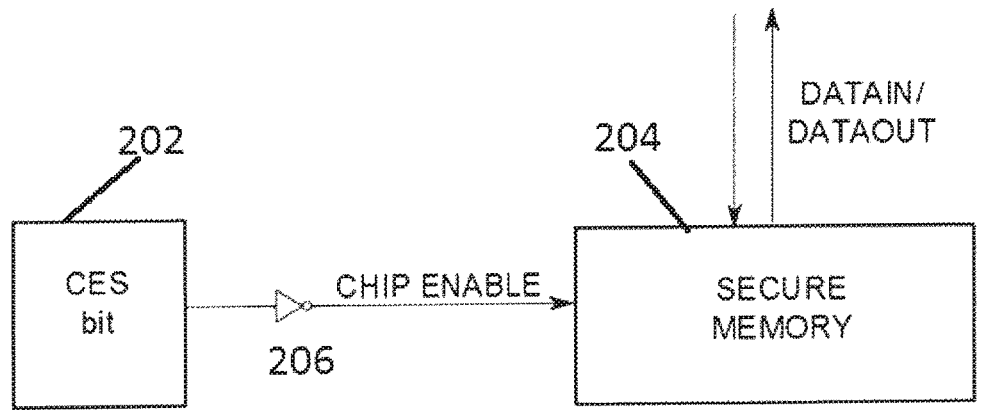
FIG. 2 is a schematic diagram of a system to control access to a secure device according to an embodiment.

FIG. 2 is a schematic diagram of a system to control access to a secure device according to an embodiment. A secure memory 204 may be accessible by an access device (not shown) to store or write values, symbols or parameters, or a combination thereof, to secure memory 204, or read or retrieve values, symbols or parameters, or a combination thereof, stored in or written to secure memory 204. "Access" to secure memory 204 may comprise different types of access including, for example, access to secure memory 204 for storing or writing values, parameters or symbols, or a combination thereof, to secure memory 204. Another type of access to secure memory 204 may comprise access to secure memory 204 to read or retrieve values, parameters or symbols, or a combination thereof stored in or written to secure memory 204. A particular type of access to secure memory 204 (e.g., access to write or store values, parameters or symbols, or a combination thereof) may be controlled, at least in part, by a signal "ACCESSENABLE_B." For example, if signal ACCESSENABLE_B has a value of logical "1," the access device may be permitted the particular type of access to secure memory 204. If signal ACCESSENABLE_B has a value of logical "0," on the other hand, the access device may not be permitted the particular type of access to secure memory 204. In the particular illustrated embodiment, the value or state of CHIP ENABLE may be determined based on a state of a signal bit CES 202, which may be placed in a low impedance or conductive state, or a high impedance or insulative state as discussed above. For example, signal CHIP ENABLE (as an output signal of inverter 206) may have a value of logical "0" if single bit CES 202 is in a low impedance or conductive state (e.g., to indicate that a particular type of access to secure memory 204 is not permitted) and may have a value of logical "1" if single bit CES 202 is in a high impedance of insulative state (e.g., to indicate that a particular type of access to secure memory 204 is permitted).

The particular embodiment of FIG. 2 is directed to implementing control of access to secure memory 204 based on a state of a single CES bit 202. In other embodiments, control of access to secure memory 204 may be controlled by states of multiple CES bits. For example, write access may be controlled by a signal write enable signal (and corresponding CES bit) and read access may be controlled by a single read enable signal (and corresponding CES bit). In another implementation, states of multiple CES bits may be used to control read and write access to thereby limit or prohibit only write access but allow read access. In another implementation, multiple processing cores or applications may share access to a single secure memory device. A corresponding multiple enable signals (e.g., determined based on states of corresponding CES bits) may be used to control access to the secure memory by corresponding applications or cores. Additionally, multiple different enable signals may be used to independently control access to different corresponding sections of a secure memory.

In a particular implementation, an impedance state of single bit CES 202 may be detected or altered by circuitry forming a bitcell. In this context, a "bitcell" or "bitcell circuit" as referred to herein comprises a circuit or portion of a circuit capable of representing a value, symbol, condition or parameter as a state. For example, a bitcell may comprise one or more memory elements that are capable of representing a value, symbol, condition or parameter as a memory state (or states) of the one or more memory elements. In particular implementations, a bitcell may represent a value, symbol, condition or parameter as a single bit or multiple bits. For example, a memory element in a bitcell may be placed in a particular memory state (e.g., a conductive or low impedance memory state, or an insulative or high impedance memory state) by independently controlling voltage and current applied across terminals of the memory element in a "write operation." As discussed below in particular implementations, such a write operation may be executed by application of a signal which is controlled to provide a critical current and voltage across terminals of a memory element to place the memory element in a particular memory state. In another aspect, a memory state of a memory element in a bitcell may be detected or sensed in a "read operation" by precharging a bitline, and then connecting the precharged bitline to a terminal of a memory element. In this context, a "bitline" comprises a conductor that is connectable to at least one terminal of a memory element during a write operation to transmit a signal altering a memory state of the memory element, or during a read operation to transmit a signal indicative of a current memory state of the memory element. According to an embodiment, a sense circuit may detect a memory state of a memory element based on a magnitude of current or voltage from a bitline in a read operation. An output signal may have a voltage that is indicative of a current memory state of bitcell 200 (e.g., as a "1," "0" or other symbol). In one aspect of a read operation, to detect a current memory state of a memory element, a voltage of a signal applied across terminals of a memory element may be controlled so as to not detectably alter the current memory state of the memory element.

Figure 3:
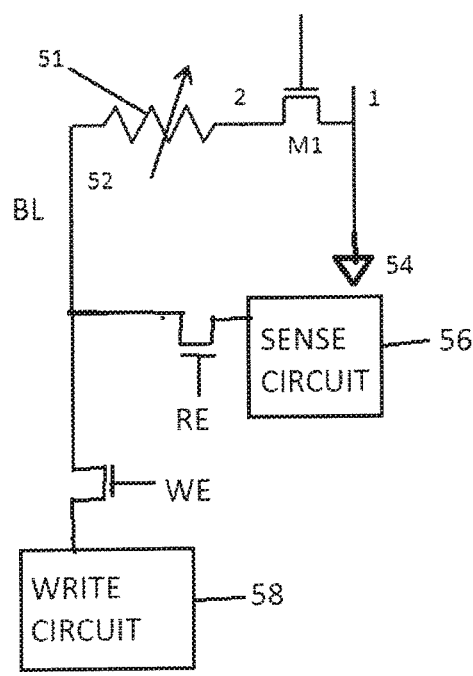
FIG. 3 is a schematic diagram of a CES storage bitcell along with an associated sense (read) and program (write) circuitry according to an embodiment.

FIG. 3 is schematic diagram of a circuit that may be used to control read and write operations to CES bit 202 according to an embodiment. Here, CES element 51 may comprise a first terminal 52 connected to a bitline BL and a second terminal 2 connected to a terminal of a FET M1. It should be understood, however, that this is merely an example of circuitry to be used in performing write or read operations on a CES element for implementing CES bit 202, and claimed subject matter is not limited in this respect.

As pointed out above in FIG. 1A, an impedance state of a CES element such as CES element 51 may be changed or determined based on a particular voltage and current applied to bitline BL. For example, a write circuit 58 may provide a signal to bitline BL such that a voltage $V_{reset}$ and a sufficient current $I_{reset}$ is applied to CES element 51 may place CES element 51 in an insulative or high impedance state in a reset operation. Likewise, write circuit 58 may also provide a signal to bitline BL such that a voltage $V_{set}$ and a sufficient current $I_{set}$ is applied to CES element 51 may place a CES element 51 in a conductive or low impedance state in a set operation. As may be observed from FIG. 1A, while a magnitude of voltage $V_{set}$ is greater than a magnitude of voltage $V_{reset}$, a magnitude of current $I_{set}$ is lower than a magnitude of current $I_{reset}$.

A write operation may comprise a particular process of placing a memory device such as CES element 51 in a particular memory state of a plurality of predetermined memory states by applying a "programming signal" generated by write circuit 58 to terminals of the memory device. Particular ones of the predetermined memory states may correspond to particular voltage levels to be applied to the memory device (e.g., $V_{set}$ and $V_{reset}$). Similarly, particular ones of the predetermined memory states may correspond to particular current levels to be applied to the memory device (e.g., $I_{set}$ and $I_{reset}$). Accordingly, in a particular embodiment, write circuit 58 may generate a programming signal to place CES element 51 in a particular impedance state in a write operation and control the programming signal to have a particular voltage level and current level corresponding to the particular impedance state. According to an embodiment, FET M1 may provide a conducting element to connect a terminal of CES element 51 to or disconnect the terminal of CES element 51 from reference node 54 responsive to a gate voltage on M1. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited in this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal. Further in this context, a "reference node" comprises a node in a circuit that is maintained at a particular voltage level or at a particular voltage difference from another node in the circuit. In one example, a reference node may comprise or be connected to a ground node. In other particular implementations, a reference node may be maintained at a particular voltage relative to that of a ground node.

In the particular example implementation of FIG. 3, a sense circuit 56 may be coupled to terminals of CES element 51 during a read operation. For example, bitline BL may be precharged to a particular voltage followed by a closing of FET M1 to apply a read voltage signal across terminals of CES element 51. A current on bitline BL responsive to the read voltage signal may then be detected or measured by sense circuit 56 to determine a current impedance state of CES element 51. In a particular implementation, the current impedance state of CES element 51 detected at sense circuit 56 may determine a value of signal "CHIP ENABLE" as a logical "0" or logical "1" (e.g., as an output signal of inverter 206).

According to an embodiment, in a first write operation to place CES element 51 in a first impedance state, write circuit 58 may generate a programming signal on bitline BL to be applied to CES element 51 by closing FET M1 responsive to a gate voltage. In the first write operation, write circuit 58 may generate a first programming signal having a first write voltage and a first write current to be applied across terminals of CES element 51 element to place CES element 51 in a first impedance (e.g., an insulative or high impedance memory state). As pointed out above in connection with the particular implementation of FIG. 2, such a write operation placing CES element 51 in the first impedance state may place signal "CHIP ENABLE" in a logical "1" state to permit a particular type of access to secure memory 204. In a second write operation to place CES 51 element in a second impedance state, write circuit 58 may generate a second programming signal having a second write voltage and a second write current to be applied to terminals of CES element 51 to place CES element 51 in a second impedance state (e.g., a particular conductive or low impedance memory state). Again as pointed out above in connection with the particular implementation of FIG. 2, such a write operation placing CES element 51 in the second impedance state may place signal "CHIP ENABLE" in a logical "0" state to disable the particular type of access to secure memory 204.

In a particular implementation, CES element 51 may have one or more properties discussed above with reference to FIG. 1A in that $|V_{reset}|<|V_{set}|$ while $|I_{reset}|>I_{set}|$. Accordingly, in the particular example illustrated in FIG. 3, a magnitude of the first write voltage may be greater than a magnitude of the second write voltage, and a magnitude of the first write current may be less than a magnitude of the second write current. Following placement of the CES element 51 in the second memory state, a third voltage (e.g., $V_{read}$) may be applied across the terminals of the CES element 51 in a read operation to detect a current impedance state of CES element 51. While the third voltage is being applied during the read operation, a current between the first and terminals may be limited to less than a magnitude of the first current (e.g., $|I_{read}|<|I_{reset}|$) to maintain the second impedance state of CES element 51 (e.g., conductive or low impedance memory state).

According to an embodiment, write circuit 58 may independently control a voltage and a current of a signal applied to CES element 51 in a write operation based, at least in part, on whether the write operation is to place CES element 51 in a conductive or low impedance memory state, or an insulative or high impedance memory state. For example, for a write operation to place CES element 51 in a conductive or low impedance memory state, a signal having a voltage $V_{set}$ and a current $I_{set}$ may be applied. Likewise, for a write operation to place CES element 51 in an insulative or high impedance memory state, a signal having a voltage $V_{reset}$ and a current $I_{reset}$ may be applied. As illustrated in FIG. 1A, voltage $V_{set}$ may have a greater magnitude than voltage $V_{reset}$ while current $I_{set}$ may have a smaller magnitude than current $I_{reset}$.

To detect a current impedance state of CES element 51, read voltage $V_{read}$ may be applied across terminals of CES element 51 responsive to closing FET M1 in a read operation. While read voltage $V_{read}$ is applied, a current flowing through bitline BL may then be sensed or measured at sense circuit 56 to detect a current impedance state of CES element 51. In the particular implementation of FIG. 2, a particular detected current impedance state may determine signal "CHIP ENABLE" to have a value of logical "0" or "1" (e.g., as an output signal of inverter 206).

According to an embodiment, a magnitude of a current flowing through terminals of CES element 51 during a read operation may be limited to less than the magnitude of $I_{reset}$. This may prevent an unintended transition of a current impedance state of CES element 51 in a conductive or low impedance memory state to an insulative or high impedance memory state during a read operation. Current flowing between terminals of CES element 51 during a read operation may be controlled, for example, by controlling a voltage applied to a gate of FET M1 during read operations. In the particular implementation of FIG. 3, FET M1 is configured as an NFET. Here, a boosted voltage on a gate of FET M1 may be applied during a write operation to permit sufficient current flowing through CES element 51 to place CES element 51 in a particular impedance state. A voltage on the gate of FET M1 then be lowered during read operations to limit current flowing through CES element 51.

As discussed above in connection with FIG. 1A, a magnitude of a current applied in a set operation to place CES element 51 in a low impedance or conductive state may determine a threshold magnitude of current $I_{reset}$ to be applied in subsequently transitioning CES element 51 to a high impedance or insulative state. For example, a current density $J_{comp}$ applied at point 116 in a set operation to transition a CES element to a low impedance or conductive state determines a threshold current density $J_{reset}$ to subsequently place the CES element in a high impedance or insulative state in a reset operation at point 108 by bringing about a Mott transition in CEM forming CES element 51.

According to an embodiment, a set operation may be applied to CES element 51 by applying a programming signal providing a current in CES element 51 that is sufficiently high to prevent a subsequent reset operation to place CES element 51 in a high impedance or insulative state. In the particular implementation of FIG. 4, a CES element, such as CES element 51, may be formed or "born on" a device in a low impedance or conductive state. Alternatively, the CES element may be placed in a low impedance or conductive state by application of a first programming signal to provide a voltage $V_{set} \geq V_0$ and current density $J_{comp}^1$ to terminals of the CES element as depicted by point 406. A second programming signal to provide a voltage $V_{reset} \geq V_B$ and current density $J_{reset} \geq J_{comp}^1$ to initiate a Mott transition in the CES element placing the CES element in a high impedance or insulative state. In the particular example implementation of FIG. 2 in which CES bit 202 in a high impedance or insulative state, the high impedance or insulative state may impart a logical state of "1" (as an output signal of inverter 206) to signal CHIPENABLE enabling access to data stored in secure memory 204. Here, for example, secure memory 204 may be accessed to, for example, write or store values, symbols or parameters, or a combination thereof, such as a security key to be subsequently read or retrieved. Following a reset operation applying a programming signal at point 408 (and, for example, access to CES bit 202), a third programming signal to provide a voltage $V_{set} \geq V_0$ and current density $J_{comp}^2$ at point 416 may be applied to terminals of the CES element for initiating a set operation returning the CES element to the low impedance or conductive state. In the particular example implementation of FIG. 2 in which CES bit 202 is in a low impedance or conductive state may, the low impedance or conductive state may impart a logical state of "1" to signal CHIP ENABLE disabling access to data stored in secure memory 204.

Figure 4:
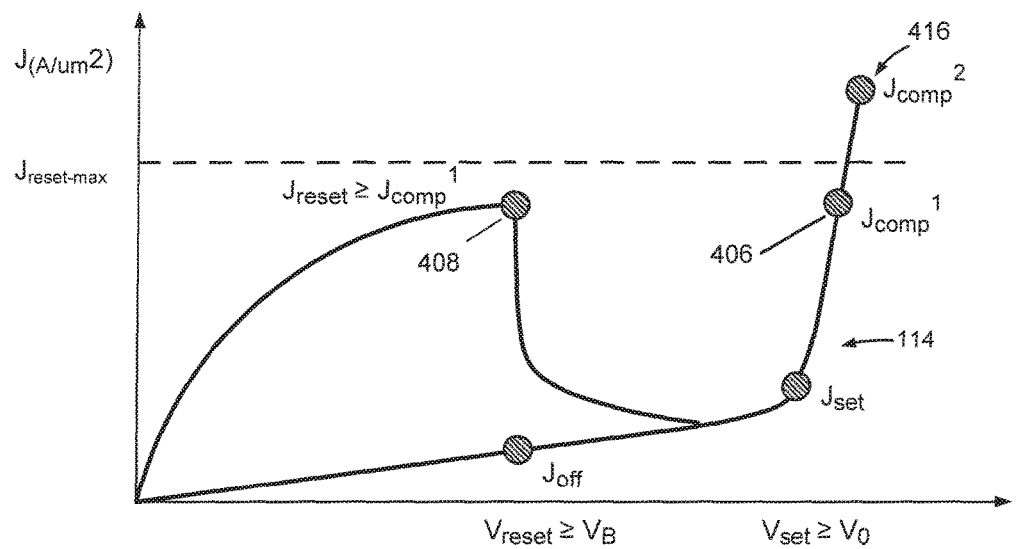
FIG. 4 is a plot of current density versus voltage in a CES device indicating a reset operation followed by a set operation according to an embodiment.

According to an embodiment, write driver circuitry (e.g., in write circuit 58) to generate a programming signal to terminals of a CES element in a write operation may comprise voltage and/or current supply circuitry. In a reset operation, such voltage and/or current supply circuitry may be capable of applying sufficient current and voltage for a programming signal at point 408. Such voltage and/or current supply circuitry may be limited to generating programming signal in a reset operation at $V_{reset}$ having a current density in the CES element that is less than $J_{reset\text{-}max}$. As shown in FIG. 4, the third programming signal at point 416 imparts a current density $J_{comp}^2 > J_{reset\text{-}max}$. Accordingly, once the CES element is >placed in a low impedance or conductive state by application of a programming signal at point 416, the available voltage and/or current supply circuitry is not capable of generating a programming imparting a current $J_{reset} \geq J_{comp}^2$ at $V_{reset}$ (e.g., to impart a current $I_{MI}$ at a critical voltage $V_{MI}$ as discussed above in expression (2)) to return the CES element to a high impedance or insulative state in a reset operation. In the particular implementation of FIG. 2 discussed above, this may permanently fix CES bit 202 to a value of "1" and a corresponding logical state of signal CHIP ENABLE at an output terminal of inverter 206 to "0" to prevent future attempts to access secure memory 204 to write.

Figure 5:
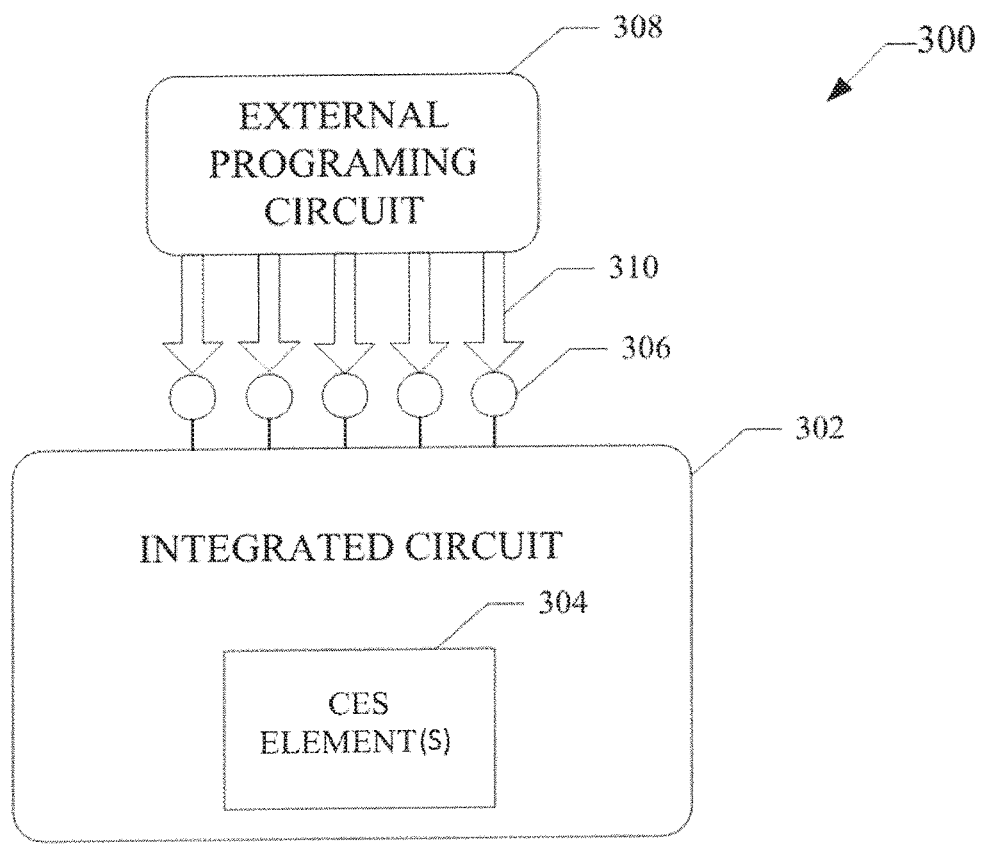
FIG. 5 is a schematic diagram of an apparatus for implementing one time and multi time programming using a CES element according to an embodiment.

FIG. 5 shows a schematic view of an exemplary apparatus 300 for implementing one-time programming using one or more CES elements 304. In an example implementation, the apparatus 300 is configured as an integrated circuit (IC) chip 302. In an example implementation, one or more CES elements 304 may be fabricated on a silicon wafer of the integrated circuit (IC) chip 302. One or more CES elements 304 may be fabricated in or "born on" a first impedance state. According to one embodiment, the first impedance state may comprise a conductive or low impedance state. In an example, the IC chip 302 may comprise a single bit CES element 304.

IC chip 302 may comprise one or more connection pads 306. At least one connection pad 306 may be coupled to one or more CES elements 304. Connection pads 306 may provide an external programing circuit 308 with access to one or more CES elements 304 to, for example, provide a programing signal 310 to a particular CES element 304 to program the one or more CES elements 304 to a particular impedance state. In an embodiment, programing signal 310 may program the one or more CES elements 304 to particular impedance states by physically modifying the one or more CES elements 304. External programing circuit 308 may program one or more CES elements 304 to a second impedance state. The second impedance state may comprise an insulative or high impedance state. In one example implementation, programing circuit 308 may provide programing signal 310 such that at least one of the one or more CES elements 304 is physically modified to the second impedance state. The connection pads 306 may be accessed for programming the one or more CES elements 304 before packaging the IC chip 302. In embodiments where at least one of the one or more CES elements 304 is used for one-time programming, once the programing circuit 308 may program the at least one of the one or more CES elements 304.

According to an embodiment, as discussed above, programing circuit 308 may initiate application of a programming signal to place at least one of the one or more CES elements 304 in a conductive or low impedance state having a sufficiently high current (e.g., at point 416 in FIG. 4) to prevent a subsequent operation to place the at least one of the one or more CES elements 304 in a high impedance or insulative state. In one particular implementation in which an impedance state of the at least one of the one or more CES elements 304 determines accessibility to affect a secure memory, permanently placing CES element 304 in the conductive or low impedance state may prevent future accesses to the secure memory (e.g., imparting a logical value of "0" to signal CHIP ENABLE).

Figure 6:
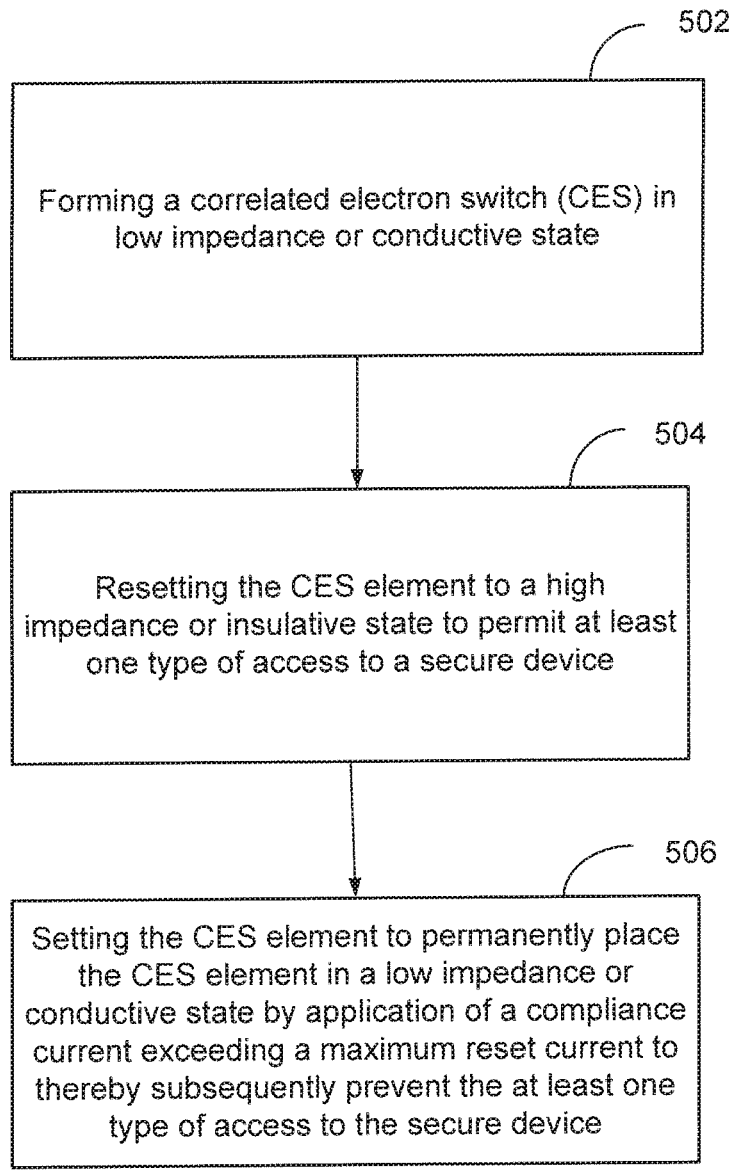
FIG. 6 is a flow diagram of a process to control access to a secure device according to an embodiment.

FIG. 6 is a flow diagram of a process to apply operations to a CES element having behavior as depicted in FIG. 4 according to an embodiment. In particular, the process of FIG. 6 may be applied to a CES element having an impedance state that determines at least one type of access to a secure memory device. At block 502, a CES element may be formed in a low impedance or conductive state in, for example, a wafer (e.g., formed in part using CMOS processes and processes to form devices from CEM discussed above). Block 504 may reset the CES element to be in the insulative or high impedance state by, for example, applying a programming signal at point 408. Here, as discussed above in connection with FIG. 2, placing the CES in the insulative or high impedance state may determine a signal that enables a type of access (e.g., write access) to a secure memory. At point 408, after the secure memory is accessed (e.g., to write a secure key, etc.), subsequent accesses may be prevented by permanently placing the CES element in the conductive or low impedance state by, for example, applying a programming signal imparting a compliance current exceeding a maximum reset current (e.g., at point 416).

In a further embodiment, one or more of a plurality of CEM devices (e.g., CES devices) may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment. In a further embodiment, CEM devices may be formed in devices in combination with conducting elements as described herein formed by the same or different processes. In an example implementation, CEM devices may be formed in combination with conducting elements using a different and/or complementary process technologies such as complementary metal oxide semiconductor (CMOS) technologies.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A method comprising:
applying a first programming signal generated by a write circuit to terminals of a correlated electron switch (CES) element to provide a first current in the CES element sufficient to place the CES element in a high impedance or insulative state; and
applying a second programming signal from the write circuit to the terminals of the CES element to provide a voltage across terminals of the CES element sufficient to place the CES element in a low impedance or conductive state, the second programming signal further providing a second current in the CES element having a magnitude greater than a magnitude of the first current,
wherein the magnitude of the second current is sufficiently high to prevent a subsequent transition of the CES element to the high impedance or insulative state responsive to a subsequently applied programming signal generated by the write circuit.

2. The method of claim 1, wherein the magnitude of the second current is sufficiently high to provide a Mott transition in correlated electron material forming the CES element.

3. The method of claim 1, and further comprising generating an access enable signal to enable a first type of access to a secure memory device, the access enable signal having a value based, at least in part, on an impedance state of the CES element.

4. The method of claim 3, wherein the access enable signal is generated to have a first value to permit the first type of access to the secure memory device responsive to the CES element having a high impedance or insulative state, and wherein the access enable signal is generated to have a second value to disable the first type of access to the secure memory device responsive to the CES element having a low impedance or conductive state.

5. The method of claim 4, wherein the first type of access to the secure memory device comprises access to write or store symbols, parameters or values, or a combination thereof, in the secure memory device.

6. The method of claim 5, and further comprising permitting a second type of access to the secure memory device while the first type of access is disabled, the second type of access comprising access to read or retrieve symbols, parameters or values, or a combination thereof, stored in the access device.

7. The method of claim 1, wherein the write circuitry comprises circuitry for controlling a voltage and current of programming signals to be applied to the terminals of the CES element, and wherein the write circuitry is incapable of generating a programming signal to apply a voltage sufficient to initiate a Mott transition in correlated electron material in the CES element while maintaining a current in the CES element meeting or exceeding the second current.

8. The method of claim 1, and further comprising, following application of the first programming signal to terminals of the CES, accessing a secure memory device to write one or more symbols, parameters or values, or a combination thereof, access to the secure memory device to write one or more symbols, parameters or values, or a combination thereof, being enabled by the CES being in the high impedance or insulative state, and wherein subsequent access to write to the secure memory is disabled following application of the second programming signal to the terminals of the CES element.

9. An apparatus comprising:
one or more correlated electron switch (CES) elements; and
a write circuit to:
generate a first programming signal for application to terminals of at least one of the one or more CES elements to provide a first current to terminals of the at least one of the one or more CES elements sufficient to place the at least one of the one or more CES elements in a high impedance or insulative state; and
generate a second programming signal for application to the terminals of the at least one of the one or more CES elements to provide a second current in the at least one of the one or more CES elements having a magnitude greater than a magnitude of the first current,
wherein the magnitude of the second current is sufficiently high to prevent a subsequent transition of the at least one of the one or more CES elements to the high impedance or insulative state responsive to a subsequently applied programming signal generated by the write circuit.

10. The device of claim 9, wherein the write circuitry comprises circuitry for controlling a voltage and current of programming signals to be applied to the terminals of the at least one of the one or more CES elements, and wherein the write circuitry is incapable of generating a programming signal to apply a voltage to terminals of the at least one of the one or more CES elements sufficient to initiate a Mott transition in correlated electron material formed in the at least one of the one or more CES elements while maintaining a current in the at least one of the one or more CES elements meeting or exceeding the second current.

11. The device of claim 9, and further comprising a secure memory that is selectively accessible based, at least in part, on a value of an access enable signal, the value of the access enable signal being based, at least in part, on a current impedance state of the at least one of the one or more CES elements.

12. The device of claim 11, and further comprising a sense circuit to detect the current impedance state of the at least one of the one or more CES elements, and wherein the access enable signal is generated based, at least in part, on the detected current impedance state.

13. The device of claim 9, wherein application of the first programming signal to terminals of the at least one of the one or more CES elements permits access to a secure memory device to write one or more values, access to the secure memory device being enabled by the at least one of the one or more CES elements being in the high impedance or insulative state.

14. The device of claim 13, and wherein subsequent access to the secure memory is disabled following application of the second programming signal to the terminals of the CES element.

15. The device of claim 9, wherein a magnitude of the second current is sufficiently high to provide a Mott transition in correlated electron material forming the CES element.

16. A method comprising:
resetting a correlated electron switch (CES) element to a high impedance or insulative state to permit at least one type of access to a secure device; and
setting the CES element to permanently place the CES element in a low impedance or conductive state by application of a compliance current exceeding a maximum reset current to thereby subsequently prevent the at least one type of access to the secure device.

17. The method of 16, and further comprising forming the CES element in the low impedance or conductive state.

18. The method of claim 16, and further comprising accessing the secure device prior to setting the CES element.

19. The method of claim 16, wherein setting the CES element to permanently place the CES element in a low impedance or conductive state comprises applying a current in the CES element that is sufficiently high to provide a Mott transition in correlated electron material forming the CES element.

* * * * *